United States Patent
DeSalvo et al.

(10) Patent No.: US 9,116,366 B2
(45) Date of Patent: *Aug. 25, 2015

(54) TUNABLE RF FILTER DEVICE USING OPTICAL WAVEGUIDE PATHS WITH SPLITTER AND COMBINER PAIRS AND RELATED METHODS

(71) Applicant: HARRIS CORPORATION, Melbourne, FL (US)

(72) Inventors: Richard DeSalvo, Satellite Beach, FL (US); Charles Middleton, Rockledge, FL (US)

(73) Assignee: HARRIS CORPORATION, Melbourne, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/596,408

(22) Filed: Jan. 14, 2015

(65) Prior Publication Data

US 2015/0125108 A1    May 7, 2015

Related U.S. Application Data

(62) Division of application No. 13/189,810, filed on Jul. 25, 2011, now Pat. No. 8,971,671.

(51) Int. Cl.
*G02F 1/035* (2006.01)
*G02F 1/01* (2006.01)
(Continued)

(52) U.S. Cl.
CPC .............. *G02F 1/011* (2013.01); *G02F 1/225* (2013.01); *G02B 6/2861* (2013.01); *G02B 6/29352* (2013.01); *G02B 6/29376* (2013.01); *G02B 6/29395* (2013.01); *G02F 1/01* (2013.01)

(58) Field of Classification Search
CPC ............. G02B 6/29376; G02B 6/2861; G02B 6/29352; G02B 6/629395; G02F 1/01; G02F 1/011; G02F 1/0113

USPC .............................. 385/1–11, 15, 27, 329–40; 359/237–239, 245–246; 398/115, 398/140–172

See application file for complete search history.

(56) References Cited

U.S. PATENT DOCUMENTS 5,404,413 A * 4/1995 Delavaux et al. ............... 385/15
5,636,046 A   6/1997 Ishikawa et al.
(Continued)

OTHER PUBLICATIONS

Yamazaki et al. Flexible-format Optical Modulators with a Hybrid Configuration of Silica Planar Lightwave Circuits and LiNbO3 Phase Modulators; NTT Photonics Technical Review, vol. 9, No. 4, Apr. 2011.

(Continued)

*Primary Examiner* — Ryan Lepisto
*Assistant Examiner* — Guy Anderson
(74) *Attorney, Agent, or Firm* — Allen, Dyer, Doppelt, Milbrath & Gilchrist, P.A.

(57) ABSTRACT

A tunable Radio Frequency (RF) filter device includes a tunable optical source generating an optical carrier signal, and a modulator coupled to the tunable optical source and modulating the optical carrier signal with an RF input signal. The tunable RF filter device may include first and second optical waveguide paths coupled to the modulator and having first and second dispersion slopes of opposite sign from each other, one or more of the first and second optical waveguide paths comprising an optical splitter and combiner pair therein, and an optical-to-electrical converter coupled to the first and second optical waveguide paths and generating an RF output signal with a frequency notch therein based upon the tunable optical source.

17 Claims, 4 Drawing Sheets

(51) Int. Cl.
*G02F 1/225* (2006.01)
*G02B 6/28* (2006.01)
*G02B 6/293* (2006.01)

(56) References Cited

U.S. PATENT DOCUMENTS

| | | | |
|---|---|---|---|
| 5,887,093 A * | 3/1999 | Hansen et al. | 385/27 |
| 6,016,371 A * | 1/2000 | Wickham et al. | 385/10 |
| 6,252,687 B1 | 6/2001 | Shikawa et al. | |
| 6,252,688 B1 | 6/2001 | Shikawa et al. | |
| 6,330,254 B1 * | 12/2001 | Hung | 372/20 |
| 6,333,941 B1 * | 12/2001 | Hung | 372/20 |
| 6,681,065 B1 | 1/2004 | Minasian et al. | |
| 7,068,943 B2 * | 6/2006 | Korolev et al. | 398/148 |
| 7,167,614 B2 | 1/2007 | Mangir et al. | |
| 7,263,257 B2 * | 8/2007 | Sugden et al. | 385/37 |
| 7,454,101 B2 * | 11/2008 | Jones | 385/27 |
| 7,587,144 B2 * | 9/2009 | Ilchenko et al. | 398/183 |
| 8,098,991 B2 | 1/2012 | DeSalvo et al. | |
| 2007/0140705 A1 * | 6/2007 | Shpantzer et al. | 398/189 |
| 2009/0214223 A1 | 8/2009 | Chen et al. | |
| 2010/0046952 A1 * | 2/2010 | DeSalvo et al. | 398/115 |
| 2010/0230621 A1 * | 9/2010 | Rideout et al. | 250/551 |
| 2013/0028551 A1 | 1/2013 | DeSalvo et al. | |

OTHER PUBLICATIONS

DeSalvo et al., "RF Photonic Notch Filters in High Dynamic Range Links," Manuscript from SPIE Defense, Security+Sensing Talk, Apr. 14, 2009, Orlando, FL, 12 pages.

Rasras et al., "Demonstration of a Fourth-Order Pole-Zero Optical Filter Integrated Using CMOS Processes", IEEE, vol. 25, No. 1, Jan. 2007, pp. 87-92.

Yan et al., "Tunable Photonic Microwave Bandpass Filter With Negative Coefficients Implemented Using an Optical Phase Modulator and Chirped Fiber Bragg Gratings", IEEE, vol. 25, No. 11, Nov. 2007, pp. 3283-3288.

Madsen et al., "Compact Integrated Tunable Chromatic Dispersion Compensator with a 4000 ps/nm Tuning Range," Optical Society of America, 2000, pp. PD9-1-PD9-3.

Mora et al., "Dynamic Optical Transversal Filters Based on a Tunable Dispersion Fiber Bragg Grating," Microwave Photonics, 2001, 4 pages.

Gruner-Nielsen et al., "A Dispersion Compensation Fiber with a Factor 5 Improvement in Figure of Merit and a Factor 4.5 Improvement in Effective Area," Optical Society of America, 2011, 2 pages.

* cited by examiner

TUNABLE RF FILTER DEVICE USING OPTICAL WAVEGUIDE PATHS WITH SPLITTER AND COMBINER PAIRS AND RELATED METHODS

FIELD OF THE INVENTION

The present invention relates to the field of radio frequency (RF) filtering, and, more particularly, to RF filtering with optical components and related methods.

BACKGROUND OF THE INVENTION

As wireless communications has become prevalent in society, it is not uncommon for two wireless communications devices to interfere with the operation of each other when operating within transmission range of each other. Indeed, this type of interference has become more frequent with increasing wireless connectivity permeating society, such as the use of cellular phones and mobile email devices. For example, when IEEE 802.11b (WiFi) wireless devices, for example, laptop computers, became readily available to the home consumer, "cordless" home telephones were capable of rendering the WiFi devices inoperable due to interference.

Interference is typically categorized into two types: narrowband interference and wideband interference. Narrowband interference includes forms of interference that are concentrated around a relatively small frequency bandwidth. Several common approaches to compensating for narrowband interference may include, for example, forward error correction (FEC), baseband coding (FHSS/DSSS spread spectrum), diversity in frequency and/or time, and signal cancellation.

Differently, wideband interference includes forms of interference that are spread out across a relatively large frequency bandwidth. Several common approaches to compensating for wideband interference may include, for example, FEC, adaptive data rate (modulation and channel bandwidth), adaptive power control, diversity in frequency and/or time, and signal cancellation.

Another common type of interference is self interference. Common causes of self interference may include, for example, collocation or frequency reuse. In particular, collocation may be caused by two wireless communication systems being deployed too closely together while frequency reuse may be caused by two wireless communication systems using the same frequency band/channel. Several approaches to compensating for self interference, which are available during planning and development stages of wireless communication systems, include, for example, installation (isolation between antennas), frequency planning, antenna pattern manipulation, synchronization of transmitters, and filtering (duplexing).

In particular, one filtering approach to narrow band interference may be to apply a notch filter to the received signal. The notch filter is a type of band-stop filter that includes a narrow stop band. In typical applications, when a communication system is subject to narrow-band interference, the stop band of the notch filter is tuned to the frequency of the narrowband interference, thereby mitigating the effect of the narrowband interference.

In some applications, it may be desirable to mitigate narrow-band interference from a relatively high-power interference source, for example, a jammer device. Typical RF notch filters may be applied in these applications, but they may suffer damage from the high-power interference source. One approach to this drawback may be a photonic implementation of an RF notch filter.

For example, U.S. Patent Application Publication No. 2010/0046952 to DeSalvo et al., also assigned to the present application's assignee, discloses an RF notch filter including photonic components. In particular, this RF notch filter comprises a modulator for modulating an optical carrier signal, and a pair of optical fibers receiving the modulated optical signal. Phase delay is introduced into one of the optical fibers by "lengthening" the optical fiber. The outputs of the optical fibers may be combined to notch filter an input signal via superposition. A potential drawback to this approach may be that this lengthening of one optical fiber may be cumbersome to implement on-the-fly. A potential drawback to typical optical notch filters may be sensitivity to polarization changes due to environmental conditions.

In particular, for the typical optical notch filter that uses a coherent optical source, the optical source may need to have a high degree of coherence. Moreover, the optical phase may need precise control mechanisms, which may add to the cost of the device. Also, coherent applications may be highly sensitive to the aforementioned polarization issue.

SUMMARY OF THE INVENTION

In view of the foregoing background, it is therefore an object of the present invention to provide a tunable RF filter device for effective notch filtering.

This and other objects, features, and advantages in accordance with the present invention are provided by a tunable RF filter device comprising a tunable optical source configured to generate an optical carrier signal, and a modulator coupled to the tunable optical source and configured to modulate the optical carrier signal with an RF input signal. The tunable RF filter device includes first and second optical waveguide paths coupled to the modulator and having first and second dispersion slopes of opposite sign. At least one of the first and second optical waveguide paths includes an optical splitter and combiner pair therein. The tunable RF filter device also includes an optical-to-electrical converter coupled to the first and second optical waveguide paths and configured to generate an RF output signal with a frequency notch therein based upon the tunable optical source. Advantageously, the tunable RF filter device notch filters the RF input signal with deep spectral nulls and a broad pass band.

In some embodiments, each of the first and second optical waveguide paths may comprise at least one optical splitter and combiner pair. The first optical waveguide path may comprise a first optical waveguide coupled to the modulator and having a first dispersion slope, and the second optical waveguide path may comprise a second optical waveguide coupled to the modulator and having a second dispersion slope having an opposite sign of the first dispersion slope. Additionally, the first optical waveguide path may comprise at least one pair of optical waveguides coupled between the optical splitter and the optical combiner, the at least one pair of optical waveguides having dispersion slopes of opposite sign.

In some embodiments, the at least one optical splitter and combiner pair may comprise a plurality thereof coupled in series. Also, the tunable RF filter device may further comprise a controller coupled to the tunable optical source and configured to tune a frequency of the optical carrier signal over a desired frequency range. The controller may be configured to tune the frequency of the optical carrier signal to generate the RF output signal with the at least one frequency notch therein by causing interference between outputs of the first and second optical waveguide paths.

Moreover, the first and second dispersion slopes may intersect at a desired frequency point in the desired frequency range. For example, the optical-to-electrical converter may comprise first and second optical detectors coupled respectively to the first and second optical waveguide paths, and a combiner coupled to the first and second optical detectors. More so, the tunable optical source may comprise a tunable continuous wave laser, for example. The tunable RF filter device may further comprise an antenna coupled to the modulator and configured to provide the RF input signal.

Another aspect is directed to a method of RF filtering. The method includes generating an optical carrier signal using a tunable optical source, modulating the optical carrier signal with an RF input signal using a modulator coupled to the tunable optical source and first and second optical waveguide paths coupled to the modulator and having first and second dispersion slopes of opposite sign from each other, at least one of the first and second optical waveguide paths comprising at least one optical splitter and combiner pair therein, and generating an RF output signal with at least one frequency notch therein based upon the tunable optical source using an optical-to-electrical converter coupled to the first and second optical waveguide paths.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
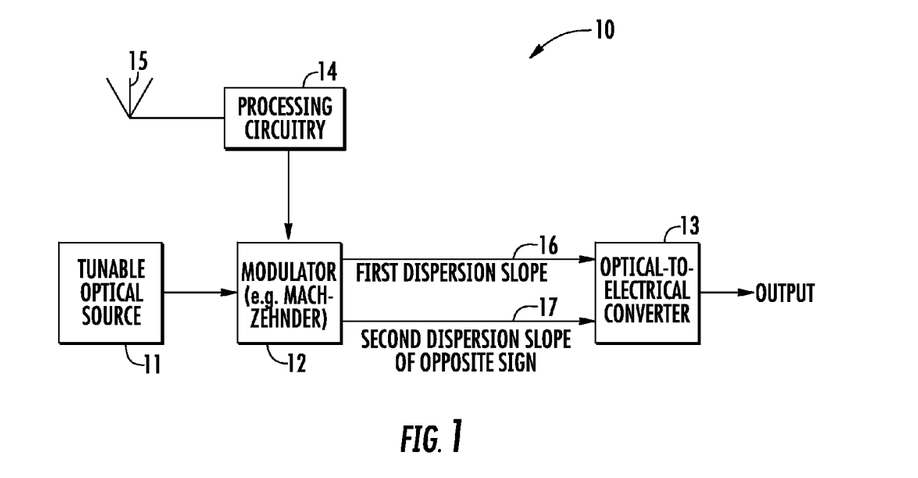
FIG. 1 is a schematic diagram of a tunable RF filter device, according to the present invention.

Referring initially to FIG. 1, a tunable RF filter device 10 according to the present invention is now described. The tunable RF filter device 10 illustratively includes an antenna 15, and processing circuitry 14 downstream therefrom for providing an input RF signal. For example, the processing circuitry 14 may comprise a receiver module.

The tunable RF filter device 10 includes a tunable optical source 11 configured to generate an optical carrier signal, and a modulator 12 coupled to the tunable optical source and configured to modulate the optical carrier signal with the RF input signal. For example, the tunable optical source 11 may comprise a tunable continuous wave laser, a diode laser, etc. The tunable RF filter device 10 includes first and second optical waveguides 16-17 coupled to the modulator 12 and having first and second dispersion slopes of opposite sign. Particularly, the modulator 12 generates a modulated optical signal and transmits the modulated optical signal into the first and second optical waveguides 16-17, i.e. the modulator is a dual output variant. As will be appreciated by those skilled in the art, the dispersion slope is a characteristic that governs induced phase delay as an optical signal travels through a medium varied over frequency, for example, a signal with a wavelength of 1525 nm may experience phase delay of 200 ps/nm.

The first and second optical waveguides 16-17 may comprise optical fibers, but of course, other waveguides may be used. In advantageous embodiments, the first and second optical waveguides 16-17 comprise photonic crystal fibers, which may be tailored to yield a wide tuning range over short fiber lengths. More specifically, with regards to the dispersion slopes of the first and second optical waveguides 16-17, the first slope may be negative and the second slope may be positive, or vice versa, or one of the first and second slopes may be zero while the other is either positive or negative and this permutation is also considered to be of opposite sign. In other words, as the modulated optical signal travels simultaneously through the first and second optical waveguides 16-17, the paths impart opposite shifts in phase at a respective frequency.

Figure 4:
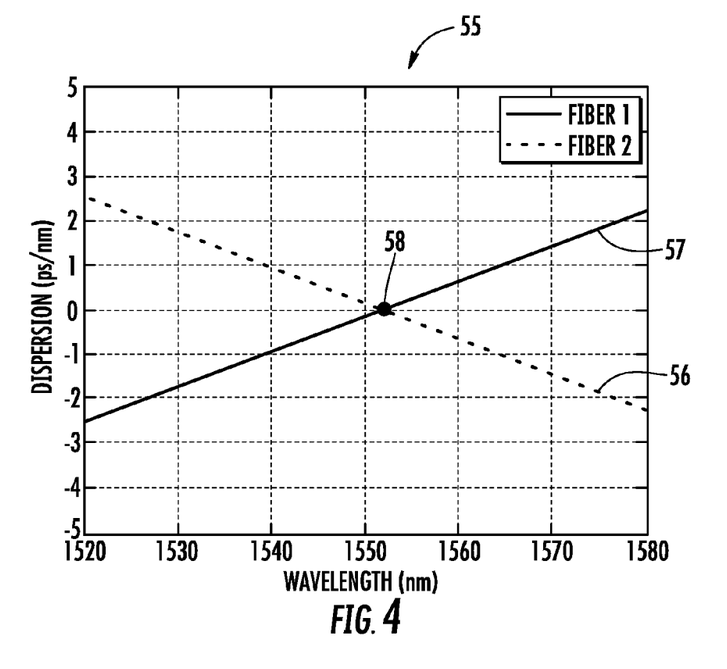
FIG. 4 is a diagram of the dispersion slopes of the waveguides of the tunable RF filter device of FIG. 2.

Referring briefly to FIG. 4 and diagram 55, illustrative examples of the first and second dispersion slopes 56-57 of opposite sign are shown. Since the first and second dispersion slopes are negative and positive, respectively, the slopes intersect at the point corresponding to an optical wavelength that produces no frequency notches in the RF spectrum. These exemplary dispersion slopes are calculated using an assumed optical fiber dispersion of 4×10−6 ps/nm/km at a wavelength of 1552 nm and a dispersion slope of ±0.08 ps/nm2/km with 1 km of fiber length.

Referring now once again to FIG. 1, the tunable RF filter device 10 includes an optical-to-electrical converter 13 coupled to the first and second optical waveguides 16-17 and is configured to generate an RF output signal with one or more frequency notches therein. The frequency notches in the modulated optical signal are generated by way of destructive interference (superposition) of the modulated optical signals output from the first and second optical waveguides 16-17. Advantageously, the frequency notches are selectively adjusted by varying the frequency of the optical carrier signal via the tunable optical source 11. Also, in some embodiments, the depth of the frequency notches are selectively adjusted by varying the optical power balance between arms of the modulator 12, as would be appreciated by those skilled in the art.

Figure 2:
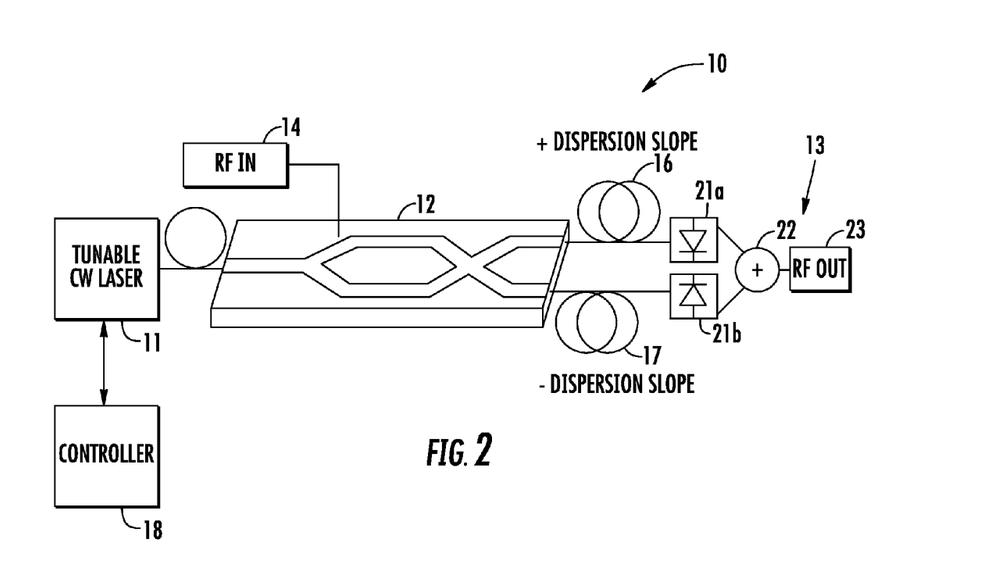
FIG. 2 is a detailed schematic diagram of the tunable RF filter device from FIG. 1.

Referring now to FIG. 2, the tunable RF filter device 10 is described in detail and includes a controller 18 coupled to the tunable optical source 11, illustrated as a continuous wave laser, and configured to cooperate therewith to tune the frequency of the optical carrier signal as needed for an application. Moreover, the optical-to-electrical converter 13 illustratively includes first and second optical detectors 21a-21b, which in some embodiments may be balanced, coupled respectively to the first and second optical waveguides 16-17, a combiner 22 (e.g. optical fiber coupler) coupled to the first and second optical detectors, and an RF output module 23 performing any needed finishing processing, such as decoder processing.

Helpfully, in balanced detector 21a-21b embodiments, the link performance may be improved with a 6 dB gain increase and with common-mode noise cancellation. This occurs by subtracting the output of two photodetectors 21a-21b: if the signals at each detector are exactly out of phase, they add when the detector outputs are subtracted. Common-mode noise is always in phase at both detectors 21a-21b, so the subtraction removes it. So a dual-output modulation device is required, and it must impart a 180° phase shift on one of the two outputs. The 6 dB of gain comes from the fact that in a modulator with a single output, half of the optical power is lost in the output coupling process, but in a dual-output modulator this optical power is retained. And 3 dB of optical power corresponds to 6 dB of RF power.

Also, the tunable RF filter device 10 may not be subject to the polarization sensitivity of typical optical devices since the balanced detectors 21a-21b convert the optical signals to electrical signals before interference occurs. In the illustrated embodiment, the modulator 12 comprises a dual-output Mach-Zehnder modulator. Of course, other suitable optical modulator types may be used.

Figure 3:
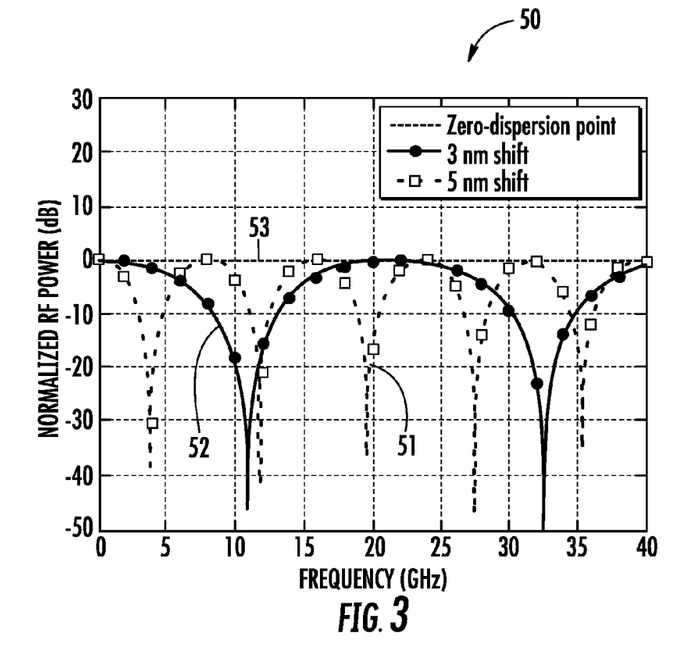
FIG. 3 is a diagram of the transfer characteristics of the tunable RF filter device of FIG. 2.

Referring now additionally to FIG. 3, a diagram 50 illustrates the transfer characteristics of the tunable RF filter device 10 as the frequency of the optical carrier signal is varied by the tunable optical source 11. The diagram 50 includes a curve 53 representing the zero dispersion point 58 (FIG. 4), i.e. when the interference from combining the modulated optical signals from the first and second optical waveguides 16-17 cancel each other out (flat transfer characteristic). Advantageously, the tunable optical source 11 can be tuned to provide the flat transfer characteristic, thereby providing an optical link with no filtering. The diagram 50 illustratively includes a curve 52 representing a 3 nm shift of the optical carrier signal from the zero dispersion point 58, and a curve 51 representing a 5 nm shift of the optical carrier signal from the zero dispersion point 58. Advantageously, the shifts in the optical carrier signal may provide versatility as the frequency notches can be adjusted depending on the application. As will be appreciated by those skilled in the art, this may be helpful in interference mitigation applications, for example, co-site interference mitigation. Also, as the skilled person will appreciate, the tunable RF filter device 10 may be used for moving object identification in radar applications and other typical digital signal processing applications.

Advantageously, the tunable RF filter device 10 may push the frequency limitations from solely RF components technology to the active photonic device realm. That is, the ability to create frequency notches over a wide bandwidth or at very high frequencies—a constant challenge for RF components—is not limited by the physical process of contrasting dispersion slopes, but would only be restricted by the frequency limitations of the modulator 12 and balanced detector 21a-21b. The periodic spacing and depth of the frequency notches is the same at 1 GHz as it is at 100 GHz. More so, the tunable RF filter device 10 is able to attenuate potential inference sources by more than 40 dB with little to no impact on a signal or signals of interest (SOI).

Another aspect is directed to a method of RF filtering. The method comprises generating an optical carrier signal using a tunable optical source 11, modulating the optical carrier signal with an RF input signal using a modulator 12 coupled to the tunable optical source and first and second optical waveguides 16-17 coupled to the modulator and having first and second dispersion slopes of opposite sign, and generating an RF output signal with at least one frequency notch therein based upon the tunable optical source using an optical-to-electrical converter 13 coupled to the first and second optical waveguides.

Figure 5:
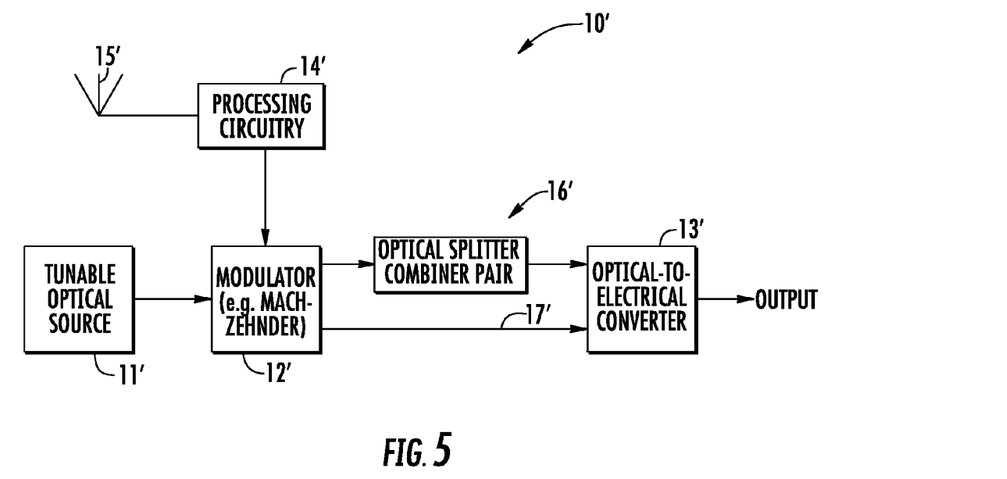
FIG. 5 is a schematic diagram of another embodiment of the tunable RF filter device, according to the present invention.

Referring now to FIG. 5, another embodiment of the tunable RF filter device 10' is now described. In this embodiment of the tunable RF filter device 10', those elements already discussed above with respect to FIGS. 1-2 are given prime notation and most require no further discussion herein. This embodiment differs from the previous embodiment in that the tunable RF filter device 10' includes first and second optical waveguide 16'-17' paths coupled to the modulator 12' and having first and second dispersion slopes of opposite sign, the first optical waveguide path illustratively including an optical splitter and combiner pair therein. Although illustrated as a typical waveguide, it should be appreciated that the second optical waveguide path 17' may also comprise an optical splitter and combiner pair therein, i.e. each of the first and second optical waveguide paths 16'-17' may comprise an optical splitter and combiner pair.

Figure 6:
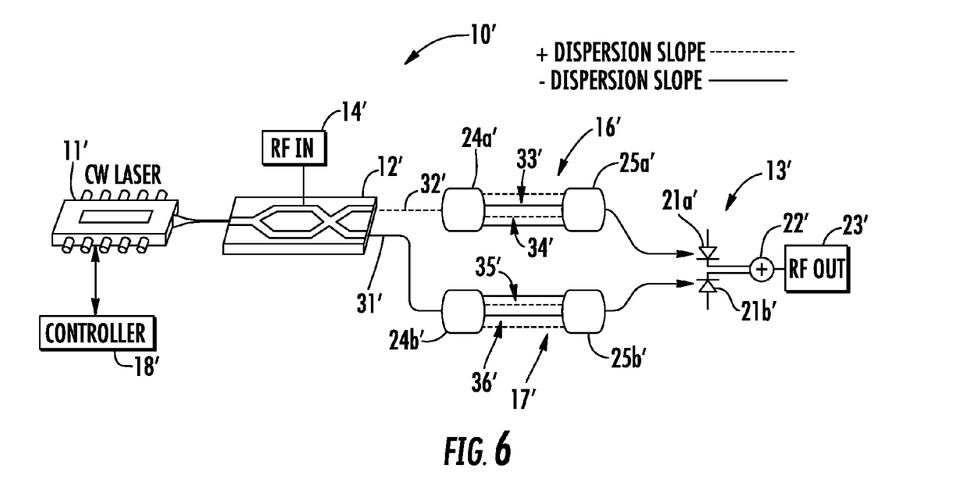
FIG. 6 is a detailed schematic diagram of the tunable RF filter device from FIG. 5.

Referring now additionally to FIG. 6, the tunable RF filter device 10' illustratively includes one optical splitter and combiner pair in each of the first and second optical waveguide paths 16'-17'. Each of the splitters 24a'-24b' includes a 1×4 splitter, and each of the combiners 25a'-25b' includes a 4×1 combiner, but of course, other configurations may be used, for example, 1×2, 1×n. As shown, the first and second optical waveguides 31'-32' couple the modulator 12' to the optical splitters 24a'-24b', the waveguide pair having dispersion slopes of opposite sign.

Moreover, the first optical splitter and combiner pair 24a', 25a' is coupled therebetween with a pair of waveguides 33'-34', each pair also comprising waveguides of opposite dispersion slopes. The second optical splitter and combiner pair 24b', 25b' is coupled therebetween with a pair of waveguides 35'-36', each pair also comprising waveguides of opposite dispersion slopes.

Figure 7:
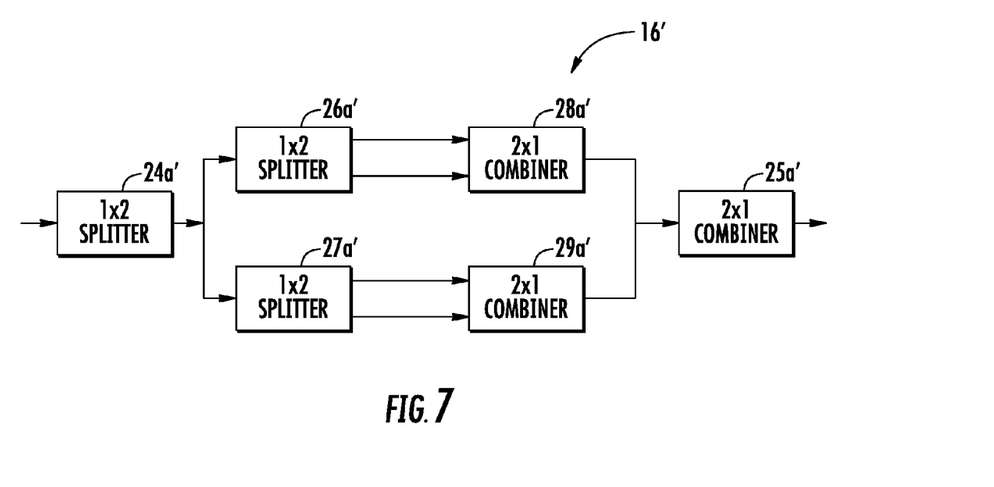
FIG. 7 is a schematic diagram of another embodiment of the optical waveguide path from the tunable RF filter device from FIG. 5.

Referring briefly and additionally to FIG. 7, another embodiment of the first optical waveguide path 16' is now described. In this embodiment, the first optical waveguide path 16' includes an optical splitter 24a' coupled in series to a plurality of parallel optical splitters 26a' and 27a', and a corresponding optical combiner 25a' coupled in series to a plurality of parallel optical combiners 28a' and 29a' downstream from the optical splitters. In other embodiments (not shown), the second optical waveguide path 17' may similarly comprise a plurality of optical splitters and a plurality of optical combiners.

Advantageously, the combination of the optical splitters and the combiners deepens the null of the notch filtering. Moreover, the pass band of the tunable RF filter device 10' is broadened, which overcomes the cosine squared limitation of the signal bandwidth. As in the above embodiments, the frequency of the notch filtering may be readily manipulated by changing the frequency of the optical carrier signal.

Figure 8:
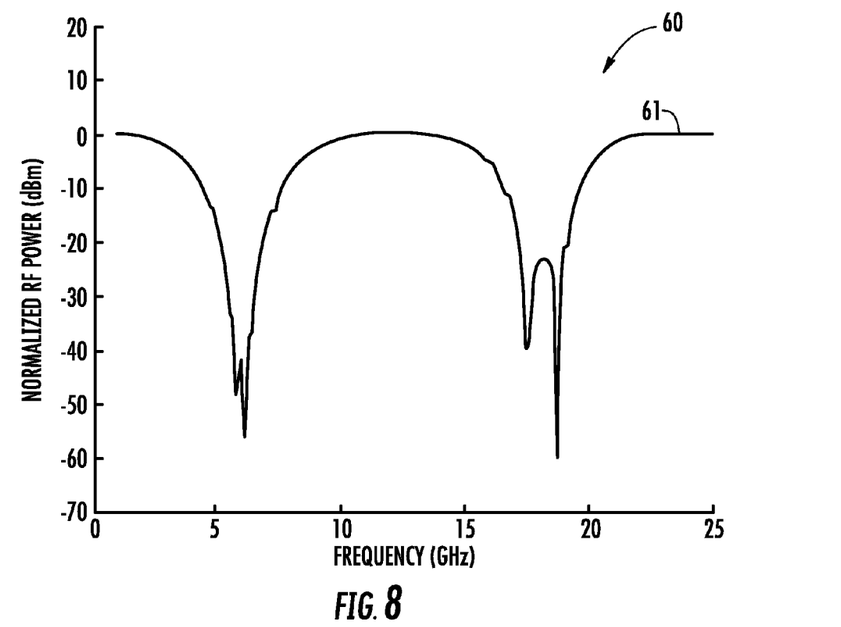
FIG. 8 is a diagram of the transfer characteristics of the tunable RF filter device of FIG. 6.

Referring now to FIG. 8, a diagram 60 illustrates the transfer characteristics of the tunable RF filter device 10'. The diagram 60 illustratively includes a curve 61 illustrating the transfer characteristics up to 25 GHz, and demonstrates two desirable deep nulls at approximately 6 GHz and 19 GHz with a wider pass band than the typical cosine squared response, based on a simulation of a system similar to that depicted in FIG. 6.

Another aspect is directed to a method of RF filtering. The method includes using a tunable optical source 11' to generate an optical carrier signal, and using a modulator 12' coupled to the tunable optical source to modulate the optical carrier signal with an RF input signal. The method may also include using first and second optical waveguide paths 16'-17' coupled to the modulator 12' and having first and second dispersion slopes of opposite sign, at least one of the first and second optical waveguide paths comprising at least one optical splitter and combiner pair therein, and using an optical-to-electrical converter 13' coupled to the first and second optical waveguide paths to generate an RF output signal with at least one frequency notch therein based upon the tunable optical source.

Other features relating to optical devices are disclosed in co-pending application "TUNABLE RF FILTER DEVICE USING OPTICAL WAVEGUIDES WITH DISPERSION SLOPES OF OPPOSITE SIGNS AND RELATED METHODS," U.S. patent application Ser. No. 13/189,768, filed Jul. 25, 2011, incorporated herein by reference in its entirety.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of Radio Frequency (RF) filtering comprising:
   generating an optical carrier signal using a tunable optical source;
   modulating the optical carrier signal with an RF input signal using a modulator coupled to the tunable optical source and first and second optical waveguide paths coupled to the modulator and having first and second dispersion slopes of opposite sign from each other, at least one of the first and second optical waveguide paths comprising at least one optical splitter and combiner pair therein; and
   generating an RF output signal with at least one frequency notch therein based upon the tunable optical source using an optical-to-electrical converter coupled to the first and second optical waveguide paths and based upon the first and second dispersion slopes being of opposite sign from each other.

2. The method of claim 1 further comprising using the first optical waveguide path comprising a first optical waveguide coupled to the modulator and having the first dispersion slope, and the second optical waveguide path comprising a second optical waveguide coupled to the modulator and having the second dispersion slope having the opposite sign of the first dispersion slope.

3. The method of claim 1 further comprising using the first optical waveguide path comprising at least one pair of optical waveguides coupled between the optical splitter and the optical combiner of the at least one optical splitter and combiner pair, the at least one pair of optical waveguides having dispersion slopes of opposite sign.

4. The method of claim 1 further comprising tuning a frequency of the optical carrier signal over a desired frequency range.

5. The method of claim 4 further comprising tuning the frequency of the optical carrier signal to generate the RF output signal with the at least one frequency notch therein by causing interference between outputs of the first and second optical waveguide paths.

6. The method of claim 1 further comprising using an antenna coupled to the modulator to provide the RF input signal.

7. A method of Radio Frequency (RF) processing comprising:
   generating an optical carrier signal;
   modulating the optical carrier signal with an RF input signal using a modulator and first and second optical waveguide paths coupled thereto, the first and second optical waveguide paths having first and second dispersion slopes of opposite sign from each other; and
   generating an RF output signal with at least one frequency notch therein from the modulated optical carrier signal and based upon the first and second dispersion slopes being of opposite sign from each other.

8. The method of claim 7 further comprising using the first optical waveguide path comprising a first optical waveguide coupled to the modulator and having the first dispersion slope, and the second optical waveguide path comprising a second optical waveguide coupled to the modulator and having the second dispersion slope having the opposite sign of the first dispersion slope.

9. The method of claim 7 further comprising using the first optical waveguide path comprising at least one pair of optical waveguides coupled between an optical splitter and an optical combiner, the at least one pair of optical waveguides having dispersion slopes of opposite sign.

10. The method of claim 7 further comprising tuning a frequency of the optical carrier signal over a desired frequency range.

11. The method of claim 10 further comprising tuning the frequency of the optical carrier signal to generate the RF output signal with the at least one frequency notch therein by causing interference between outputs of the first and second optical waveguide paths.

12. The method of claim 7 further comprising using an antenna coupled to the modulator to provide the RF input signal.

13. A method of Radio Frequency (RF) processing comprising:
   receiving an RF input signal from an antenna;
   modulating an optical carrier signal with the RF input signal using a modulator and first and second optical waveguide paths coupled thereto, the first and second optical waveguide paths having first and second dispersion slopes of opposite sign from each other; and
   generating an RF output signal with at least one frequency notch therein from the modulated optical carrier signal and based upon the first and second dispersion slopes being of opposite sign from each other.

14. The method of claim 13 further comprising using the first optical waveguide path comprising a first optical waveguide coupled to the modulator and having the first dispersion slope, and the second optical waveguide path comprising a second optical waveguide coupled to the modulator and having the second dispersion slope having the opposite sign of the first dispersion slope.

15. The method of claim 13 further comprising using the first optical waveguide path comprising at least one pair of optical waveguides coupled between an optical splitter and an optical combiner, the at least one pair of optical waveguides having dispersion slopes of opposite sign.

16. The method of claim 13 further comprising tuning a frequency of the optical carrier signal over a desired frequency range.

17. The method of claim 16 further comprising tuning the frequency of the optical carrier signal to generate the RF output signal with the at least one frequency notch therein by causing interference between outputs of the first and second optical waveguide paths.

* * * * *